(12) United States Patent
Higuchi et al.

(10) Patent No.: US 8,425,711 B2
(45) Date of Patent: *Apr. 23, 2013

(54) GLASS SUBSTRATE WITH PROTECTIVE GLASS, AND PROCESS FOR PRODUCING DISPLAY DEVICE USING GLASS SUBSTRATE WITH PROTECTIVE GLASS

(75) Inventors: Toshihiko Higuchi, Chiyoda-ku (JP); Satoru Takaki, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/551,684

(22) Filed: Sep. 1, 2009

(65) Prior Publication Data

US 2009/0321005 A1 Dec. 31, 2009

Related U.S. Application Data

(63) Continuation of application No. PCT/JP2008/052570, filed on Feb. 15, 2008.

(30) Foreign Application Priority Data

Mar. 12, 2007 (JP) .................................. 2007-061889

(51) Int. Cl.
*B32B 38/10* (2006.01)
(52) U.S. Cl.
USPC ........... 156/249; 156/285; 156/289; 156/247; 428/40.1; 428/41.7; 428/41.8; 525/477; 525/478; 525/479; 528/15; 528/31; 528/32; 524/588
(58) Field of Classification Search .................. 428/40.1, 428/41.7, 41.8; 156/249, 285, 289, 247; 525/477, 478, 479; 528/15, 31, 32; 524/588
See application file for complete search history.

(56) References Cited

U.S. PATENT DOCUMENTS

| 4,770,942 A | * | 9/1988 | Itoh et al. ...................... 428/447 |
| 5,869,150 A | * | 2/1999 | Iwamoto ...................... 428/1.52 |

(Continued)

FOREIGN PATENT DOCUMENTS

| CN | 1885111 A | 12/2006 |
| JP | 58-54316 | 3/1983 |

(Continued)

OTHER PUBLICATIONS

U.S. Appl. No. 13/187,631, filed Jul. 21, 2011, Higuchi.

(Continued)

*Primary Examiner* — Khanh P Nguyen
*Assistant Examiner* — Margaret Squalls
(74) *Attorney, Agent, or Firm* — Oblon, Spivak, McClelland, Maier & Neustadt, L.L.P.

(57) ABSTRACT

To provide a glass substrate with protective glass which suppresses formation of microscopic scratches on the back surface of the glass substrate in the production process for a display device, and which prevents a strength decrease in the process or formation of etch pits after a chemical etching treatment; a process for producing a display device by using the glass substrate with protective glass; and a double-sided removable resin sheet for the glass substrate with protective glass.

A glass substrate with protective glass, which comprises a glass substrate and a protective glass plate laminated on each other, and which is characterized in that the glass substrate and the protective glass plate are laminated by a double-sided removal resin sheet.

10 Claims, 2 Drawing Sheets

U.S. PATENT DOCUMENTS

| | | | |
|---|---|---|---|
| 6,037,026 A | 3/2000 | Iwamoto | |
| 7,669,319 B2 * | 3/2010 | Seo et al. | 29/842 |
| 2006/0094834 A1 | 5/2006 | Aoki et al. | |
| 2008/0135175 A1 | 6/2008 | Higuchi | |
| 2009/0110882 A1 | 4/2009 | Higuchi | |
| 2009/0148682 A1 | 6/2009 | Higuchi | |

FOREIGN PATENT DOCUMENTS

| | | |
|---|---|---|
| JP | 3005718 A | 1/1991 |
| JP | 8-86993 | 4/1996 |
| JP | 8086993 A | 4/1996 |
| JP | 9-105896 | 4/1997 |
| JP | 9105896 A | 4/1997 |
| JP | 2000-241804 | 9/2000 |
| JP | 2000-252342 | 9/2000 |
| JP | 2003-216068 | 7/2003 |
| JP | 2005001953 A | 1/2005 |
| JP | 2006016555 A | 1/2006 |
| WO | WO 2006/003853 A2 | 1/2006 |
| WO | WO 2007/129554 A1 | 11/2007 |
| WO | WO 2008/007622 A1 | 1/2008 |

OTHER PUBLICATIONS

Combined Taiwanese Office Action and Search Report Issued Nov. 22, 2012 in Patent Application No. 097106832 (with English translation of Categories of Cited Documents).

* cited by examiner

GLASS SUBSTRATE WITH PROTECTIVE GLASS, AND PROCESS FOR PRODUCING DISPLAY DEVICE USING GLASS SUBSTRATE WITH PROTECTIVE GLASS

TECHNICAL FIELD

The present invention relates to a glass substrate to be used for a display device such as a liquid crystal display or an organic EL display, more specifically, a laminate of a glass substrate and a back-protective glass plate, to be used for producing a display device by using such a glass substrate, a process for producing a display device by using the laminate, and a double-sided removable resin sheet for the glass substrate with protective glass.

BACKGROUND ART

A process for producing a liquid crystal display device (LCD) generally comprises a step of forming an array on a glass substrate, a step of forming a color filter on a glass substrate different from the above glass substrate, a step of bonding the glass substrate having an array formed thereon with the glass substrate having a color filter formed thereon (an array/color filter bonding step), a step of injecting liquid crystal and a step of sealing the injection inlet. In each of the steps, since a back surface of the glass substrate, namely, an opposite surface from the surface on which an array or a color film is to be formed, is directly contacted with a carrier jig, a hotplate, etc., whereby microscopic scars are formed on its surface, which may cause a strength decrease of the glass substrate itself.

In the field of a medium or small sized liquid crystal display device (LCD), an organic EL display device (OLED), particularly, a portable display device such as a mobile, a digital camera or a cellular phone, weight saving and reduction in thickness of a display device have been important objects, and since the reduction in thickness of the glass substrate has been progressed, the strength decrease of the glass substrate originated from such a step may especially be a serious problem.

Further, in order to make a glass substrate thinner, a step of carrying out a chemical etching treatment on a glass substrate to make the substrate thickness thin after the array/color filter bonding step, has been widely applied. However, in a case where if microscopic scars formed in the above step are present on the glass substrate, pits (etch pits) having a diameter of from tens to hundreds µm will be formed on the glass substrate surface after the chemical etching treatment, which would lead to optical defects.

Therefore, in order to overcome the above problem, a process for producing a display device has been suggested, wherein a prescribed treatment for producing a display device is carried out in such a state that a glass substrate is bonded with another protective glass substrate, and after the completion of the treatment, the glass substrate and the protective glass substrate are separated (Patent Documents 1 to 6).

In these processes for producing a display device, a method for laminating and fixing the glass substrate and the protective glass substrate on each other may, for example, be a method of fixing them by means of electrostatic adsorptivity or vacuum adsorptivity caused between the glass substrates (e.g. Patent Document 1), a method of fixing both ends of the glass substrates by means of glass frit (e.g. Patent Document 2), a method of fusing the two glass substrates by irradiating the vicinity of the edge surfaces of peripheral portions with laser beams (e.g. Patent Document 3), and a method of disposing a removable adhesive or adhesive sheet over the entire surfaces of the glass substrates, and fixing them by the adhesive force (e.g. Patent Documents 4 to 6).

These methods have latent problems which may adversely affect a display device to be produced.

That is, by the method of fixing the glass substrates by means of electrostatic adsorptivity or vacuum adsorptivity, the method of fixing both ends of the glass substrates by means of glass frit, or the method of fusing the two glass substrates by irradiating the vicinity of edge surfaces of peripheral portions with laser beams, it is difficult to avoid inclusion of bubbles or convex defects due to foreign matters such as dust in the process of laminating and closely bonding the glass substrates without any interlayer, and accordingly it is difficult to obtain a glass substrate laminate having a smooth surface.

In the case of the method of disposing a removable adhesive or adhesive sheet over the entire surface of the glass substrates, it is easy to avoid inclusion of bubbles as compared with the case of directly laminating the glass substrates, and it is considered that convex defects due to foreign matters are less likely to occur. However, it is difficult to separate the glass substrate and the protective glass substrate, and the glass substrate may be broken at the time of separation. Further, remaining of the adhesive on the glass substrate after the separation is also problematic. Further, the display device production process comprises a step which requires treatment at high temperature, such as a step of firing an insulating film or an alignment film in a process for producing a liquid crystal display device. Therefore, heat resistance is required for the adhesive or adhesive sheet, to be used for the display device, but a method which satisfies both heat resistance and removability has not been proposed yet.

Patent Document 1: JP-A-2000-241804
Patent Document 2: JP-A-58-54316
Patent Document 3: JP-A-2003-216068
Patent Document 4: JP-A-8-86993
Patent Document 5: JP-A-9-105896
Patent Document 6: JP-A-2000-252342

DISCLOSURE OF THE INVENTION

Objects to be Accomplished by the Invention

In order to solve the above problems of conventional techniques, the present inventors have proposed a glass substrate with protective glass, which comprises a glass substrate and a protective glass substrate laminated on each other by a resin layer having removability, in WO2008/007622. A process for producing the glass substrate with protective glass in the proposal comprises a step of forming a resin layer having removability on a protective glass substrate and a step of laminating a glass substrate on the resin layer-formed surface of the protective glass substrate, and the step of forming a resin layer having removability on a protective glass substrate includes applying silicone for release paper on the protective glass substrate, and curing the silicone for release paper.

Further, the above-proposed process for producing a glass substrate with protective glass can sufficiently solve the object of suppressing formation of microscopic scars to be formed on a back-surface of a glass substrate in a step of producing a display device, and preventing a strength decrease of the glass substrate in the step or preventing formation of etch pits by chemical etching treatment. However, there is a problem such that the resin layer having removability cannot easily be separated from the protective glass substrate since the resin layer having removability is fixed on the protective glass substrate, such being problematic in view of recycle of the protective glass substrate.

In order to solve the above problems of conventional techniques, the present invention has objects to provide a glass substrate with protective glass which suppresses formation of microscopic scars on a back-surface of a glass substrate in a step of producing a display device, which prevents a strength decrease of the glass substrate in the step or prevents formation of etch pits by chemical etching treatment and which has excellent recyclability of the protective glass plate; a process for producing a display device by using the glass substrate with protective glass; and a double-sided removable resin sheet for the glass substrate with protective glass.

Means to Accomplish the Objects

In order to accomplish the above objects, the present invention provides a glass substrate with protective glass (hereinafter referred to as "a glass substrate with protective glass of the present invention"), which comprises a glass substrate and a protective glass plate laminated on each other, and which is characterized in that the glass substrate and the protective glass plate are laminated by a double-sided removable resin sheet.

The double-sided removable resin sheet is preferably an acrylic resin sheet, a polyolefin resin sheet, a polyurethane resin sheet or a silicone resin sheet.

The silicone resin sheet is preferably a silicone resin sheet having releasability and non-adhesive property on both sides, or a silicone resin sheet having releasability and slight adhesive property on both sides.

The silicone resin sheet having releasability and non-adhesive property on both sides, or the silicone resin sheet having releasability and slight adhesive property on both sides, is preferably a sheet made of a cured product of silicone for release paper.

The cured product of silicone for release paper, is preferably a crosslinked product of a linear polyorganosiloxane having vinyl groups at both terminals and/or in its side chain, and a methylhydrogen polysiloxane having hydrosilyl groups in its molecule.

Before curing, the cured product of silicone for release paper preferably has a molar ratio of hydrosilyl groups of the methylhydrogen polysiloxane to vinyl groups of the linear polyorganosiloxane being from 1.3/1 to 0.7/1.

In the glass substrate with protective glass of the present invention, the thickness of the glass substrate is preferably at least 0.04 mm and less than 1.0 mm, and the total thickness of the protective glass plate and the double-sided removable resin sheet is preferably at least 0.1 mm.

In the glass substrate with protective glass of the present invention, the difference between the linear expansion coefficient of the glass substrate and the linear expansion coefficient of the protective glass plate is preferably at most $15 \times 10^{-7}$/° C.

Further, the present invention provides a process for producing a display device by using a glass substrate with protective glass (hereinafter referred to as "a process for producing a display device of the present invention"), which comprises a step of laminating a glass substrate and a protective glass plate by a double-sided removable resin sheet, a step of carrying out a prescribed treatment for producing a display device on the glass substrate, and a step of separating the glass substrate from the protective glass plate.

In the process for producing a display device of the present invention, the step of laminating a glass substrate and a protective glass plate by a double-sided removable resin sheet is preferably carried out by vacuum pressing or vacuum lamination.

In the process for producing a display device of the present invention, the step of laminating a glass substrate and a protective glass plate by a double-sided removable resin sheet, preferably includes removing, from one side of the double-sided removable resin sheet having a release material laminated on both sides, the release material so that the sheet is adhered to and laminated on the surface of either the glass substrate or the protective glass plate, and then removing the release material from the other side of the double-sided removable resin sheet so that the sheet is adhered to and laminated on the surface of the other one of the glass substrate and the protective glass plate.

In the process for producing a display device of the present invention, the double-sided removable resin sheet is preferably an acrylic resin sheet, a polyolefin resin sheet, a polyurethane resin sheet or a silicone resin sheet.

The silicone resin sheet is preferably a silicone resin sheet having releasability and non-adhesive property on both sides, or a silicone resin sheet having releasability and slight adhesive property on both sides.

The silicone resin sheet having releasability and non-adhesive property on both sides, or the silicone resin sheet having releasability and slight adhesive property on both sides, is preferably a silicone resin sheet made of a cured product of silicone for release paper.

The cured product of silicone for release paper, is preferably a crosslinked product of a linear polyorganosiloxane having vinyl groups at both terminals and/or in its side chain, and a methylhydrogen polysiloxane having hydrosilyl groups in its molecule.

In the silicone for release paper, the molar ratio of hydrosilyl groups of the methylhydrogen polysiloxane to vinyl groups of the linear polyorganosiloxane is preferably from 1.3/1 to 0.7/1.

In the process for producing a display device of the present invention, the double-sided removable resin sheet having a release material laminated on both sides is preferably formed by applying silicone for release paper to the release face of one of the release materials and curing it, and then laminating the other release material on the surface of the double-sided removable resin sheet.

The silicone for release paper is preferably heat-cured at a temperature of from 50 to 250° C.

Further, the present invention provides a double-sided removable resin sheet for a glass substrate with protective glass (hereinafter referred to as "a double-sided removable resin sheet of the present invention"), which is to be used for laminating a glass substrate and a protective glass plate.

The double-sided removable resin sheet of the present invention preferably has a release material laminated on both sides.

The double-sided removable resin sheet of the present invention is preferably made of a cured product of silicone for release paper.

In the double-sided removable resin sheet of the present invention, the silicone for release paper preferably contains a linear polyorganosiloxane having vinyl groups at both terminals and/or in its side chain, a methylhydrogen polysiloxane having a hydrosilyl groups in its molecule, and a platinum catalyst.

In the silicone for release paper of the present invention, the molar ratio of hydrosilyl groups of the methylhydrogen polysiloxane to vinyl groups of the linear polyorganosiloxane is preferably from 1.3/1 to 0.7/1.

Effects of the Invention

The glass substrate with protective glass of the present invention comprises a glass substrate and a protective glass plate laminated on each other by a double-sided removable resin sheet, whereby in the step of separating the glass substrate from the protective glass plate, it is possible to peel the double-sided removable resin sheet from both the glass substrate and the protective glass plate, and it is thereby possible to recycle the protective glass plate by itself. Further, a step of applying and drying a removable resin to the protective glass plate is unnecessary, thus securing a high productivity.

The glass substrate with protective glass of the present invention comprises a glass substrate and a protective glass plate laminated by a double-sided removable resin sheet, and the back surface of the glass substrate (an opposite surface from a surface on which an array or a color filter is formed) is not directly contacted to a carrier jig, a hotplate, etc. in a step of forming a display device, whereby there is no concern that scratches are formed on the back surface of the glass substrate in the step. Further, the back surface of each of the glass substrate and the protective glass plate is contacted with a flexible resin layer having removability whereby it is possible to easily separate the laminate into the glass substrate and the protective glass plate, and during the separation into the glass substrate and the protective glass plate, no scratches are formed on the back surface of the glass substrate, and the glass substrate is unlikely to be broken.

Therefore, it is possible to significantly suppress the decrease in strength of the glass substrate after the protective glass plate is peeled and to suppress the etch pit formation when a chemical etching treatment is carried out afterwards.

In the process for producing a display device of the present invention, when the step of laminating a glass substrate and a protective glass plate by a double-sided removable resin sheet is carried out by using vacuum pressing or vacuum lamination, it is possible to suppress inclusion of bubbles into the interface of the resin sheet and the glass substrate. As a result, there is an advantage that in a step of forming transparent electrodes of e.g. ITO under a vacuum atmosphere, it is possible to suppress formation of defects originated from included air bubbles.

The double-sided removable resin sheet of the present invention having a release material laminated on both sides has a release material laminated on a side of the double-sided removable resin sheet on which the glass substrate is to be laminated, whereby attachment of foreign matters such as dust before use can be prevented. At the time of use, the operation is easy since the release material is removed so that the resin sheet is adhered to and laminated on the glass substrate and the protective glass plate, and such is important particularly for practical operation.

MEANINGS OF SYMBOLS

Figure 1A:
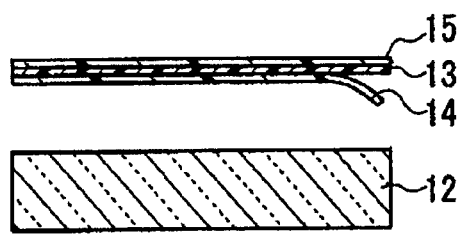
FIGS. 1(a) to 1(d) are cross-sectional schematic views illustrating the procedure to produce a glass substrate with protective glass of the present invention.

1: Glass substrate with protective glass
11: Glass substrate
12: Protective glass plate
13: The double-sided removable resin sheet (silicone resin sheet)
14, 15: Release material
20, 21, 2:5, 26, 30 and 31: Polycarbonate member

BEST MODE FOR CARRYING OUT THE INVENTION

Now, the glass substrate with protective glass of the present invention will be described.

The glass substrate with protective glass of the present invention comprises a glass substrate and a protective glass plate laminated on each other, and is characterized in that the glass substrate and the protective glass plate are laminated by a double-sided removable resin sheet.

Here, the double-sided removable resin sheet (hereinafter sometimes referred to simply as a resin sheet) is preferably not fixed on surfaces of the glass substrate and the protective glass plate. That is, the removability of the resin sheet is exhibited by both the glass substrate and the protective glass plate.

The glass substrate is a glass substrate for a display device such as LCD or OLED and has a thickness of at least 0.04 mm, specifically at least 0.04 mm and less than 1.0 mm, preferably from 0.04 mm to 0.7 mm. It more preferably has a thickness of at least 0.1 mm, specifically from 0.1 mm to 0.7 mm. The thickness of the glass substrate is particularly preferably from 0.4 mm to 0.7 mm for such a reason that such a glass substrate is easy to handle at the time of producing a display device by using the glass substrate, and that the glass substrate rarely breaks when it is handled. When the glass substrate is made thin by carrying out a chemical etching treatment, from a glass substrate having a thickness of from 0.4 mm to 0.7 mm, a glass substrate having a thickness of from 0.1 mm to 0.4 mm is obtained in many cases. On the other hand, in a case where a chemical etching treatment is not essential, the thickness of the glass substrate is preferably from 0.04 to 0.4 mm, whereby the glass substrate can be used for a display device as it is.

Further, the display device as an object of the present invention is a medium or small sized display device which is to be used mainly for a mobile terminal such as a cellular phone or PDA, or a digital camera. The display device is mainly LCD or OLED, and LCD includes TN-type, STN-type, FE-type, TFT-type and MIM-type.

Characteristics required for the glass substrate, such as the heat shrinkage ratio, surface shape and chemical resistance, vary depend on the type of a display device. Accordingly, the glass substrate may be made of alkali glass. However, alkali-free glass is preferred since the heat shrinkage ratio is low.

In the present invention, the glass substrate is preferably one having a low heat shrinkage ratio. In the case of glass, the linear expansion coefficient defined in JIS R3102 (1995) is used as an index for heat expansion and heat shrinkage. The glass substrate preferably has a linear expansion coefficient of at most $50 \times 10^{-7}/°C.$, more preferably at most $45 \times 10^{-7}/°C.$, furthermore preferably at most $40 \times 10^{-7}/°C.$, particularly preferably at most $30 \times 10^{-7}/°C.$, especially preferably at most $20\times10^{-7}/°$ C. The lower limit of the linear expansion coefficient of the glass substrate is preferably $0.1\times10^{-7}/°$ C.

The protective glass plate is laminated on the glass substrate for a purpose of protecting the glass substrate, specifically, preventing formation of scars on the back surface of the glass substrate in the step. Here, the back surface of the glass substrate is a surface opposite from a surface on which an array or a color filter is to be formed, in a production step of LCD, and it is a surface which is directly contacted with a carrier jig, a hotplate, etc.

The thickness of the protective glass plate is not particularly limited, but it is preferably a thickness for a laminate with the glass substrate to be transported by the current production line. For example, the current production line is designed to transport a substrate having a thickness of 0.5 mm, whereby when the thickness of the glass substrate is 0.3 mm, the thickness of the protective glass plate is preferably 0.2 mm combined with the thickness of the double-sided removable resin sheet. The most common current production line is one designed to transport a glass substrate having a thickness of 0.7 mm. In such a case, when the thickness of the glass substrate is 0.4 mm, the thickness of the protective glass plate is preferably 0.3 mm as combined with the thickness of the double-sided removable resin sheet. However, the production line is not limited to one designed to transport a glass substrate having a thickness of 0.5 mm or 0.7 mm, but it is sometimes designed to transport a glass substrate having a thickness other than such a thickness. For example, there is a case where the line is designed to transport a glass substrate having a thickness of less than 0.5 mm, and there is also a case where the line is designed to transport the glass substrate having a thickness of more than 0.7 mm, e.g. 1.1 mm. In such a case, when the thickness of the glass substrate is 0.7 mm, the thickness of the protective glass plate is preferably 0.4 mm as combined with the thickness of the double-sided removable resin sheet.

Further, in a case where a chemical etching treatment is not essential, the thickness of the protective glass plate is preferably from 0.1 to 0.7 mm, more preferably from 0.3 to 0.7 mm as combined with the thickness of the resin sheet, whereby the glass substrate can be used for a display device at it is.

Considering the thickness of the double-sided removable resin sheet which will be described later, the thickness of the protective glass plate is preferably at least 0.1 mm, specifically from 0.1 to 0.8 mm as combined with the thickness of the double-sided removable resin sheet.

Further, the protective glass plate is one to prevent scratches to be formed on the back surface of the glass substrate, and its material is not particularly limited and it may be either alkali glass or alkali-free glass. However, the linear expansion coefficient of the protective glass plate is preferably substantially the same as the linear expansion coefficient of the glass substrate. When the linear expansion coefficient of the protective glass plate is larger than the linear expansion coefficient of the glass substrate, in a heating step in the production process for a display device, expansion of the protective glass plate is suppressed by the glass substrate with protective glass, whereby the glass substrate with protective glass may have warpage. On the other hand, when the linear expansion coefficient of the protective glass plate is smaller than the linear expansion coefficient of the glass substrate, the expansion of the glass substrate is suppressed by the glass substrate with protective glass, whereby the glass substrate with protective glass may have warpage.

In the present specification, the case where the linear expansion coefficients are substantially the same, does not mean that the linear expansion coefficient of the glass substrate completely matches with the linear expansion coefficient of the protective glass plate, and there may be some difference between them. The difference in the linear expansion coefficient between the glass substrate and the protective glass plate is preferably at most $35\times10^{-7}/°$ C., more preferably at most $25\times10^{-7}/°$ C., furthermore preferably at most $15\times10^{-7}/°$ C. Particularly preferably, there is no difference in the linear expansion coefficient between the glass substrate and the protective glass plate.

Further, since the protective glass plate has an object to protect the back surface of the glass substrate, its size is preferably equal to or larger than the size of the glass substrate.

The double-sided removable resin sheet of the present invention is preferably in a state where a release material is laminated on both sides so that no foreign matters such as dust are attached to a surface to be laminated on a glass substrate to be used.

In production of the glass substrate with protective glass of the present invention, a release material is removed from the double-sided removable resin sheet having a release material laminated on both sides so that the resin sheet is adhered to and laminated on surfaces of the glass substrate and the protective glass plate. More specifically, the protective glass plate and the glass substrate are laminated so that the protective glass plate and the back surface of the glass substrate face each other by means of the double-sided removable resin sheet. More specifically, from one side of the double-sided removable resin sheet having a release material laminated on both sides, the release material is removed so that the resin sheet is adhered to and laminated on the surface of either the glass substrate or the protective glass plate, and then the release material is removed from the other side of the double-sided removable resin sheet so that the resin sheet is adhered to and laminated on the surface of the other one of the glass substrate and the protective glass plate.

Figure 1B:
Figure 1C:
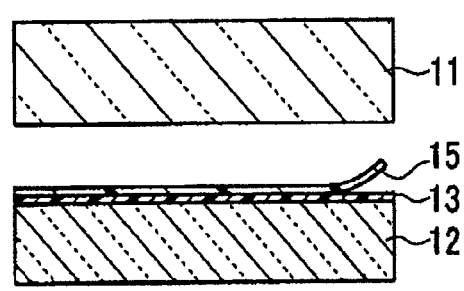
Figure 1D:
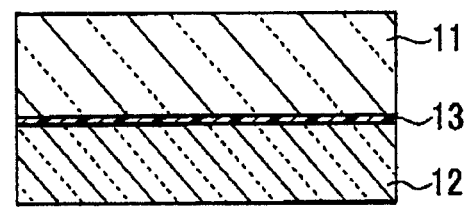

FIGS. 1(a) to 1(d) are views illustrating the procedure to produce the above-described glass substrate with protective glass of the present invention. A double-sided removable resin sheet 13 shown in FIG. 1(a) is in a state where release materials 14 and 15 are laminated on both sides. From this state, the release material 14 on the side which faces a protective glass plate 12 is removed so that the double-sided removable resin sheet 13 is adhered to and laminated on the surface of the protective glass plate 12 as shown in FIG. 1(b). Then, as shown in FIG. 1(c), the release material 15 on the side which faces a glass substrate 11 is removed so that the double-sided removable resin sheet 13 is adhered to and laminated on the surface of the glass substrate 11 as shown in FIG. 1(d), whereby a glass substrate 1 with protective glass of the present invention is produced.

In FIGS. 1(a) to 1(d), the double-sided removable resin sheet 13 is adhered to and laminated on the surface of the protective glass plate 12 and then adhered to and laminated on the surface of the glass substrate 11. However, the double-sided removable resin sheet 13 may be adhered to and laminated on the surface of the glass substrate 11 and then adhered to and laminated on the surface of the protective glass plate 12. Further, the release materials 14 and 15 on both sides may be removed and then the double-sided removable resin sheet 13 is adhered to and laminated on the glass substrate 11 and the protective glass plate 12 simultaneously.

In the present specification, the "double-sided removable resin sheet" means a resin sheet having proper flexibility so that it can follow micro-irregularities of the glass substrate, so that both sides of the resin sheet are removable after the glass substrate is laminated. Specifically, either a resin sheet having releasability and proper adhesive property (slight adhesive property) on both sides or a resin sheet having releasability and non-adhesive property on both sides may be used.

The double-sided removable resin sheet is preferably an acrylic resin sheet, a polyolefin resin sheet, a polyurethane resin sheet or a silicone resin sheet.

Among them, the double-sided removable resin sheet is particularly preferably a silicone resin sheet having releasability and non-adhesive property on both sides, or a silicone resin sheet having releasability and slight adhesive property on both sides.

The silicone resin sheet having releasability and non-adhesive property on both sides is a silicone resin sheet having proper flexibility, and it is not one such that both sides of the silicone resin sheet fix the glass substrate and the protective glass plate by adhesive force like an adhesive, but it is one to fix the glass substrate and the protective glass plate by a force attributable to a Van der Waals force between the faced solid molecules, i.e., a bonding strength.

On the other hand, the silicone resin sheet having releasability and slight adhesive property on both sides is one to fix the glass substrate and the protective glass plate by a certain level of adhesive force by both sides of the silicone resin sheet in addition to the above bonding strength. Further, the silicone resin sheet having releasability and non-adhesive property on both sides, and the silicone resin sheet having releasability and slight adhesive property on both sides, will be generally referred to as "a silicone resin sheet having releasability and weak adhesive property on both sides".

Specifically, the silicone resin sheet having releasability and weak adhesive property on both sides fixes the glass substrate and the protective glass plate by a bonding strength or by a bonding strength and a slight adhesive force by both sides of the silicone resin sheet, whereby a force to slide the glass substrate and the protective glass plate in parallel to the interface of the laminated sheet, i.e., a shear force, shows a high value. Therefore, the glass substrate will not be displaced from the protective glass plate in the production process for a display device. Accordingly, there will be no such a trouble that the glass substrate and the protective glass plate are separated by such displacement.

With respect to the shear force of the silicone resin sheet having releasability and weak adhesive property on both sides, since the glass substrate will not be displaced from the protective glass plate during the production process for a display device, in a shear strength test which will be described later, the load when glass is peeled off is preferably at least 0.1 kg wt/cm$^2$, particularly at least 0.3 kg wt/cm$^2$, further preferably at least 0.5 kg wt/cm$^2$.

On the other hand, due to the releasability and weak adhesive property of the silicone resin sheet, the force to peel the glass substrate from the protective glass plate in a perpendicular direction, namely, the peeling force, is low. Therefore, it is possible to easily separate the protective glass plate from the glass substrate after a prescribed treatment for producing a display device on the glass substrate, is carried out. The force required to peel the silicone resin sheet from the protective glass plate is much lower than the peeling force, and it is possible to easily separate the silicone resin sheet from the protective glass plate after separated from the glass substrate.

With respect to the peeling force of the silicone resin sheet having releasability and weak adhesive property on both sides, from the viewpoint that the protective glass plate can easily be separated from the glass substrate, the load to peel the protective glass plate in a peel test (1), which will be described later, is preferably at most 2 kg wt/cm$^2$, particularly preferably at most 1 kg wt/cm$^2$, further preferably at most 0.8 kg wt/cm$^2$.

When a flexible one capable of roll-to-roll such as a resin film, is used to protect the glass substrate, the peeling force should be evaluated by a peel test with an angle such as a 90° peel test or a 180° peel test. However, in a peel test for a glass substrate and a protective glass plate having a certain level of rigidity, it is necessary to evaluate the peeling force by a testing method such as the peel test (1) (so-called a 0° peel test). Therefore, even when the peeling force is evaluated, it is preferably in the above range by a testing method such as the peel test (1).

Specific modes of the silicone resin sheet having releasability and non-adhesive property on both sides, and the silicone resin sheet having releasability and slight adhesive property on both sides, will be described later.

With respect to the silicone resin sheet having releasability and non-adhesive property on both sides, the surface energy on both sides is preferably from 16 to 21 erg/cm$^2$ (unit), more preferably from 17 to 20 erg/cm$^2$ (unit), for a reason that air bubbles included at the time of lamination, can easily be removed, and the protective glass plate can easily be separated from the glass substrate.

The silicone resin sheet having releasability and non-adhesive property on both sides fixes the glass substrate by a bonding strength, whereby a force to slide the glass substrate and the protective glass plate in parallel to the interface of the laminated sheet, i.e. a shear force, shows a high value. Therefore, the glass substrate will not be displaced from the protective glass plate in the production process for a display device. Accordingly, there will be no such a trouble that the glass substrate and the protective glass plate are separated by such displacement.

On the other hand, due to the releasability and weak adhesive property of the silicone resin sheet, the force to peel the glass substrate from the protective glass plate in a perpendicular direction, i.e. the peeling force, is low. Therefore, it is possible to very easily separate the protective glass plate from the glass substrate after a predescribed treatment for producing a display device on the glass substrate, is carried out, and it is possible to easily peel the silicone resin sheet from the protective glass plate after separated from the glass substrate.

The silicone resin sheet having releasability and non-adhesive property on both sides has a shear force of preferably at least 0.1 kg wt/cm$^2$, more preferably at least 0.3 kg wt/cm$^2$, particularly preferably at least 0.5 kg wt/cm$^2$. Further, it has a peeling force of preferably at most 1 kg wt/cm$^2$, more preferably at most 0.8 kg wt/cm$^2$, particularly preferably at most 0.5 kg wt/cm$^2$.

However, in a case where both the glass substrate and the protective glass plate are thick, for example, when the thickness of a thinner one between the glass substrate and the protective glass plate is at least 0.7 mm, the property of the resin sheet to follow the shapes of the glass substrate and the protective glass plate decreases, whereby the force to fix the glass substrate and the protective glass plate may be insufficient by only a bonding strength. In such a case, it is preferred to use a silicone resin sheet having releasability and slight adhesive property on both sides. The silicone resin sheet having releasability and slight adhesive property on both sides has relatively low peeling force, preferably at most 0.8 kg wt/cm$^2$.

In the case of the silicone resin sheet having releasability and slight adhesive property on both sides, a glass substrate is fixed by a proper adhesive force in addition to the bonding strength, whereby even if both the glass substrate and the protective glass plate are thick, the force to fix the glass substrate and the protective glass plate will not be insufficient. Besides, the peeling force is at most 0.8 kg wt/cm², whereby the force required to peel the glass substrate from the protective glass plate, i.e. the peeling force is low, and it is possible to easily separate the protective glass plate from the glass substrate after a predescribed treatment to produce a display device on the glass substrate, is carried out, and it is possible to easily peel the silicone resin sheet from the protective glass plate after separated from the glass substrate.

The silicone resin sheet having releasability and weak adhesive property on both sides is excellent in heat resistance, whereby even after a heating treatment, e.g. after heating at a temperature of 300° C. in atmosphere for 1 hour, it is possible to exhibit the above characteristics such that the peeling force is low, while the shear force is high.

Hereinafter, in the present specification, the silicone resin sheet having releasability and weak adhesive force on both sides, will be generally referred to as "a silicone resin sheet of the present invention" when it shows the common characteristics.

Since the silicone resin sheet of the present invention, has proper flexibility, bubbles are less likely to be included at the time of lamination, and even if bubbles are included, since both sides of the resin sheet are non-adhesive or slightly adhesive, the bubbles can easily be removed by pressure bonding by means of rolls, press or the like.

The silicone resin sheet of the present invention is preferably made of a cured product of silicone for release paper. The silicone for release paper comprises, as the chief agent, a silicone containing a linear dimethyl polysiloxane in its molecule which is particularly excellent in release properties among silicones. The silicone for release paper contains the chief agent and a crosslinking agent and is fixed on the surface of the substrate by curing by means of a catalyst, a photopolymerization initiator or the like. The silicone resin sheet made of a cured product of the silicone for release paper has appropriate flexibility and excellent release properties on both sides.

When the silicone for release paper having such properties is used as the silicone resin sheet of the present invention, a silicone resin sheet having appropriate flexibility and having releasability and weak adhesive property on both sides can be obtained.

The silicone for release paper can be classified by the curing mechanism into a condensation reaction silicone, an addition reaction silicone, an ultraviolet-curable silicone and an electron beam-curable silicone. Any of these can be used in the present invention. However, most preferred is an addition reaction silicone from such a viewpoint that the curing reaction is easily carried out, and a silicone resin sheet of the present invention is easily formed when the cured coating film is formed, and from the viewpoint of heat resistance of the cured product. Further, it is possible to ascertain to some extent whether or not the silicone for release paper is contained in the silicone resin sheet by IR (infrared spectroscopy) or from the strength or adhesive property of the resin sheet.

The addition reaction silicone comprises a linear polyorganosiloxane having vinyl groups at both terminals and/or in its side chain as the chief agent, and methylhydrogen polysiloxane having hydrosilyl groups in its molecule as the crosslinking agent, and it undergoes a heat curing reaction in the presence of a platinum catalyst.

The linear polyorganosiloxane having vinyl groups at both terminals and/or in its side chain, is a compound represented by either one of the following formulae.

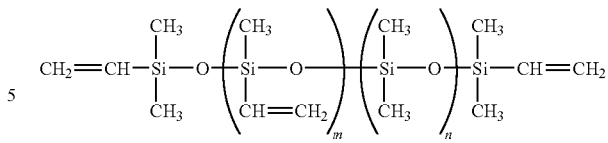

wherein each of m and n is an integer and may be 0. When m is 0, the linear polyorganosiloxane will have vinyl groups at both terminals. When m is an integer of at least 1, the linear polyorganosiloxane will have vinyl groups at both terminals and in its side chain.

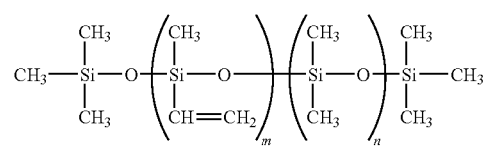

wherein m is an integer of at least 2, and n is an integer and may be 0. In such a case, the linear polyorganosiloxane will have vinyl groups in its side chain.

The methylhydrogen polysiloxane having hydrosilyl groups in its molecule is a compound represented by the following formula.

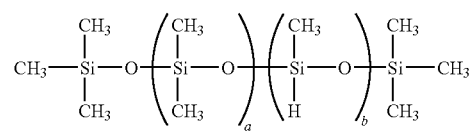

wherein "a" is an integer, and b is an integer of at least 1.

Further, some of methyl groups at a terminal of the methylhydrogen polysiloxane may be a hydrogen atom or a hydroxyl group.

In the addition reaction silicone, the chief agent comprising the linear polyorganosiloxane having vinyl groups at both terminals, in its side chain, or at both terminals and in its side chain, and the crosslinking agent comprising methylhydrogen polysiloxane having hydrosilyl groups in its molecule are mixed so that the molar ratio of the hydrosilyl groups to the vinyl groups is preferably from 0.7/1 to 1.3/1, particularly preferably from 0.8/1 to 1.2/1.

If the molar ratio of the hydrosilyl groups to the vinyl groups exceeds 1.3/1, the peeling force after the heat treatment increases, and the releasability may be deteriorated. Further, if the molar ratio of the hydrosilyl groups to the vinyl groups is less than 0.7/1, the crosslink density of a cured product decreases, whereby the chemical resistance, etc., may have a problem. The reason why the peeling force after the heating treatment increases when the molar ratio of the hydrosilyl groups to the vinyl groups exceeds 1.3/1, is not apparent, but it is considered that some kind of reaction between unreacted hydrosilyl groups in the cured product and silanol groups at the glass surface, by the heating treatment, is involved.

The catalyst to be used for heat curing reaction is preferably a platinum catalyst, and as the platinum catalyst, a known one may be used. Specifically, it may, for example, be a chloroplatinic acid compound such as tetrachloroplatinic (II) acid or hexachloroplatinic(IV) acid, an alcohol compound or an aldehyde compound of chloroplatinic acid; a complex salt of chloroplatinic acid with an olefin.

The amount of the platinum catalyst used is preferably from 0.1 to 20 parts by mass, more preferably from 1 to 10 parts by mass, per 100 parts by mass of the silicone for release paper.

The structures of silicone for release paper to be used for forming a silicone resin sheet having releasability and non-adhesive property and to be used for forming a silicone resin sheet having releasability and slight adhesive property, are not substantially different. Specifically, depending on the level of the crosslink density in a resin cured product to be obtained by heat-curing the silicone for release paper, a silicone resin sheet may be separated into a case of having releasability and non-adhesive property or into a case of having releasability and slight adhesive property. More specifically, when the crosslink density in a resin cured product is high, a resin cured product will have adhesive property.

From such a viewpoint, it may be said that in the above linear polyorganosiloxane, when vinyl groups contained in its side chain increase, a resin cured product to be obtained will have adhesive property.

The silicone for release paper may be a solvent, emulsion or solventless form, and any form can be used. However, in view of productivity, safety and environmental properties, the solventless form is preferred. In the case of using the solventless form, bubbles are less likely to remain in the silicone resin sheet since a solvent which causes bubbles at the time of curing, i.e. heat curing, ultraviolet curing or electron beam curing is not contained.

The silicone resin sheet of the present invention may be formed by only one silicone for release paper or may be formed by two or more silicones for release paper. In a case where it is formed by two or more silicones for release paper, it may be a silicone resin sheet having a multilayer structure in which the two or more silicones for release paper are laminated with each other, or may be a mixed silicone resin sheet containing the two or more silicones for release paper in one sheet.

With respect to the silicone resin sheet of the present invention, it is preferred that components in the silicone resin sheet are less likely to migrate to the glass substrate or the protective glass plate when the glass substrate and the protective glass plate are separated, and the silicone resin sheet is peeled from the glass plate or the protective glass plate, that is, the resin sheet preferably has low silicone migration property.

The degree of easiness of migration of components in the silicone resin sheet, can be judged by employing the residual adhesion ratio of the silicone resin sheet as an index. The residual adhesion ratio of the silicone resin sheet can be measured by the following method.

Method for Measuring Residual Adhesion Ratio

The release material is peeled from one side of the silicone resin sheet, and a standard adhesive tape (CELLOTAPE (trade mark) CT405A-15 (manufactured by NICHIBAN Co., Ltd.)) with a width of 15 mm is bonded to the surface of the silicone resin sheet manually and heated at 70° C. for 20 hours in the air. After a lapse of 20 hours, the silicone resin sheet is peeled from the standard adhesive tape. The peeled standard adhesive tape is bonded to the surface of a clean glass substrate (e.g. AN100 (manufactured by Asahi Glass Company, Limited)), and then the 180° peel strength (300 mm/min) is measured (peel strength (A)).

The same standard adhesive tape as above is bonded to the surface of a clean glass substrate (e.g. AN100 (manufactured by Asahi Glass Company, Limited)) manually and then left at room temperature in the air for 20 hours. After a lapse of 20 hours, the standard adhesive tape is peeled from the surface of the glass substrate. The peeled standard adhesive tape is bonded to the surface of a glass substrate (e.g. AN100 (manufactured by Asahi Glass Company, Limited)), and the 180° peel strength (300 mm/min) is measured (peel strength (B)).

The residual adhesion ratio is determined from the following formula.

$$\text{Residual adhesion ratio (\%)} = \text{peel strength (A)}/\text{peel strength (B)} \times 100$$

The silicone resin sheet of the present invention preferably has a residual adhesion ratio obtained by the above measuring method of at least 95%, more preferably at least 98%. When the residual adhesion ratio is at least 95%, it is considered that migration of components in the resin sheet from the silicone resin sheet to the glass substrate surface or to the protective glass plate surface is very low. Therefore, since components in the silicone resin sheet are less likely to migrate to the surface of the glass substrate after separation, bonding failure or the like is less likely to occur when a polarizing plate or the like is bonded to the surface of the glass substrate. Further, components in the silicone resin sheet are less likely to migrate to the surface of the protective glass plate after the silicone resin sheet is peeled, and such is convenient in recycling of the protective glass plate.

To obtain a silicone resin sheet having low silicone migration property, a silicone for release paper containing no components having high migration properties may be used. A non-reactive silicone is blended in some cases so that the silicone for release paper has releasability. In such a case, as the non-reactive silicone, a linear dimethylpolysiloxane having a very high molecular weight or a relatively low molecular weight linear dimethylpolysiloxane having compatibility with the cured coating film lowered by introducing a phenyl group or a higher alkyl group, is used. Since such a non-reactive silicone is a component having high migration property, the silicone for release paper used in the present invention preferably has a non-reactive silicone content of at most 5 mass %, and it more preferably contains substantially no non-reactive silicone.

In the present invention, specifically, a suitable silicone for release paper may, for example, be KNS-320A, KS-847 (each manufactured by Shin-Etsu Silicones), TPR6700 (manufactured by GE Toshiba Silicone), a combination of vinyl silicone "8500" (manufactured by Arakawa Chemical Industries, Ltd.) and methylhydrogen polysiloxane "12031" (manufactured by Arakawa Chemical Industries, Ltd.), a combination of vinyl silicone "11364" (manufactured by Arakawa Chemical Industries, Ltd.) and methylhydrogen polysiloxane "12031" (manufactured by Arakawa Chemical Industries, Ltd.), or a combination of vinyl silicone "11365" (manufactured by Arakawa Chemical Industries, Ltd.) and methylhydrogen polysiloxane "12031" (manufactured by Arakawa Chemical Industries, Ltd.).

The suitable thickness of a double-sided removable resin sheet, which includes the above silicone resin sheet, is controlled by a thinner thickness between the glass substrate and the protective glass plate. As the plate thickness increases, the property of the resin sheet to follow the shapes of the glass substrate and the protective glass plate decreases, whereby the bonding properties of the resin sheet to the glass substrate and the protective glass plate decreases, whereby in order to secure sufficient bonding properties to the glass substrate and the protective glass plate, the resin sheet is needed to be thickened. Further, the most preferred thickness of the resin sheet may vary depending on the level of flexibility or adhesive property of the resin sheet to be used. Specifically, when the thickness of a thinner one between the glass substrate and the protective glass plate is X mm and the thickness of the resin sheet is Y μm, the thickness of the resin sheet is preferably within a range of Y=50X+20±10.

In general, the thickness of the double-sided removable resin sheet is preferably from 1 to 100 μm. If the thickness of the resin sheet is thinner than 1 μm, the bonding strength of the resin sheet to the glass substrate and the protective glass plate may be insufficient. Further, when foreign matters are included, convex defects are likely to form on the glass substrate. On the other hand, when the thickness exceeds 100 μm, there is little contribution to properties as the double-sided removable resin sheet, and it takes time for curing of the resin in production of the resin sheet, such being economically disadvantageous.

The thickness of the double-sided removable resin sheet is more preferably from 5 to 50 μm. When the thickness of the resin sheet is from 5 to 50 μm, even if the glass substrate and the protective glass plate are thick, for example, the thickness of the thinner one between the glass substrate and the protective glass plate is at least 0.5 mm, the bonding strength of the resin sheet to both substrates will unlikely to be insufficient. The thickness of the resin sheet is further preferably from 15 to 40 μm.

A process for forming the double-sided removable resin sheet is not particularly limited, and it is suitably selected from known methods. When the silicone for release paper is used for the double-sided removable resin sheet, the silicone for release paper is applied in a predetermined thickness and cured on the release face of the release material to be used for e.g. an adhesive separate film, and then another release material is laminated on the cured silicone for release paper, whereby a double-sided removable resin sheet having a release material laminated on both sides is obtained.

As a method of applying the silicone for release paper to the release face of the release material, a known method may be used. Specifically, it may, for example, be a spray coating method, a die coating method, a spin coating method, a dip coating method, a roll coating method, a bar coating method, a screen coating method or a gravure coating method. Such a coating method can properly be selected depending upon the type of silicone for release paper. In a case where the release material is in the form of a roll, the die coating method, the roll coating method or the gravure coating method is preferred.

In a case where the silicone for release paper is a solventless type, its amount to be applied is preferably from 1 g/m² to 100 g/m².

The release material may be one having a release agent applied to the surface of e.g. a PET film, a polyethylene or a polypropylene. The release material to be laminated on the cured silicone for release paper may be e.g. a PET film, a polyethylene or a polypropylene having no release agent applied to its surface.

In the case of an addition reaction silicone, a mixture of the silicone for release paper containing the chief agent and the crosslinking agent, with a catalyst, is applied on the release face of the release material by any one of the above methods, and then heat-cured. The heat-curing conditions vary depending upon the amount of the catalyst blended, and for example, when 2 parts by mass of a platinum catalyst is blended per 100 parts by mass of the silicone for release paper, the mixture is heat-cured in the air at a temperature of from 50° C. to 250° C., preferably from 80° C. to 200° C. for from 5 to 60 minutes, preferably from 10 to 30 minutes. The heating temperature is properly selected in the above temperature range depending on the material of the release material.

In order to obtain a silicone resin sheet having low silicone migration property, it is preferred that the curing reaction proceeds as far as possible so that unreacted silicone components will not remain in the silicone resin sheet. By heat-curing under the above condition, unreacted silicone components will not remain in the silicone resin sheet. If the heating time is too long, or if the heating temperature is too high as compared with the above conditions, oxidative decomposition of the silicone resin will take place simultaneously, and low molecular weight silicone components will form, thus increasing the silicone migration property.

It is preferred that the curing reaction proceeds as far as possible so that unreacted silicone components will not remain in the silicone resin sheet, also to obtain favorable releasability after heat treatment.

The shape of the double-sided removable resin sheet to be laminated between the glass substrate and the protective glass plate is not particularly limited so long as the glass substrate is not displaced from the protective glass plate when the production process for a display device is carried out by using the glass substrate with protective glass. Therefore, it is not necessary to laminate the resin sheet so as to cover the entire surface of the glass substrate or the protective glass plate, and the resin sheet may be laminated to cover a part of the surface of the glass substrate or the protective glass plate. In a case where the resin sheet is laminated so as to cover a part of the surface of the glass substrate or the protective glass plate, a plurality of such resin sheets may be laminated between the glass substrate and the protective glass plate so long as the resin sheet are not overlaid one on another. However, if the resin sheet is laminated at a random position on the surface of the glass substrate and the protective glass plate, the bonding properties to the glass substrate and the protective glass plate may be deteriorated.

From the double-sided removable resin sheet having a release material laminated on both sides obtained by the above procedure, the release material is removed so that the resin sheet is adhered to and laminated on the surface of the glass substrate and the protective glass plate. More specifically, the protective glass plate and the glass substrate are laminated so that the protective glass plate and the back surface of the glass substrate face each other by means of the resin sheet. More specifically, as illustrated in FIGS. 1(a) to 1(d), from one side of the double-sided removable resin sheet having a release material laminated on both sides, the release material is removed so that the resin sheet is adhered to and laminated on the surface of either the glass substrate or the protective glass plate, and then the release material is removed from the other side of the resin sheet so that the resin sheet is adhered to and laminated on the surface of the other one of the glass substrate and the protective glass plate. Further, the double-sided removable resin sheet is laminated on the back surface of the glass substrate. The procedure to laminate the protective glass plate or the glass substrate on the glass substrate or the protective glass plate to which the double-sided removable resin sheet is adhered and laminated, may be carried out by means of a known method. For example, in a normal pressure environment, the protective glass plate or the glass substrate is laminated on the other side of the resin sheet, and then, the laminate may be pressure bonded by using rolls or a press. By pressure bonding by rolls or a press, a more closely bonded laminate will be obtained. That is, the resin sheet and the protective glass plate are more closely bonded to each other, and the resin sheet and the glass substrate are more closely bonded to each other. Further, by pressure bonding by rolls or a press, the bubbles included in the resin sheet can easily be removed. However, with a view to suppressing inclusion of bubbles or securing suitable bonding, it is preferred to use a vacuum lamination method or a vacuum pressing method. By lamination under vacuum, even if very small bubbles remain, the bubbles will not grow by heating, whereby convex defects of the glass substrate are less likely to form.

Further, the release materials on both sides may be peeled, and then the resin sheet is adhered to and laminated on the glass substrate and the protective glass plate simultaneously.

When the glass substrate and the protective glass plate are to be laminated by means of the resin sheet, it is necessary to sufficiently clean the surface of the glass substrate and the protective glass plate to laminate them in an environment of a high cleanness.

Extremely small foreign matters may be absorbed in the resin sheet by deformation of the resin sheet having flexibility, and they may not influence the bonding properties of the glass substrate with protective glass after the lamination. However, depending on their amounts or sizes, the bonding properties of the glass substrate with protective glass may be deteriorated.

Now, the process for producing a display device of the present invention will be described.

In the process for producing a display device of the present invention, after the glass substrate with protective glass of the present invention is formed by the above procedure, a prescribed treatment to produce a display device on the glass substrate of the glass substrate with protective glass is carried out. In the present specification, the prescribed treatment to produce a display device, widely includes various treatments carried out in the production process when a display device such as an LCD or an OLED is produced.

Specific examples of treatments carried out include, with reference to production of an LCD as an example, a step of forming an array on the glass substrate, a step of forming a color filter on a glass substrate different from the above glass substrate, a step of bonding the glass substrate on which the array is formed and the glass substrate on which the color filter is formed (an array/color filter bonding step). As a treatment carried out in these steps, specifically, for example, washing with pure water, drying, film deposition, resist coating, exposure, developing, etching and removal of resist may, for example, be mentioned.

Further, as a step carried out after the array/color filter bonding step, a step of reduction in thickness of the glass substrate by a chemical etching treatment, a liquid crystal injection step and a step of sealing the inlet carried out after the treatment may be mentioned, and treatment carried out in these steps is also included in the above treatments.

However, all of these treatments do not need to be carried out in a state of the glass substrate with protective glass. For example, from the viewpoint of handling efficiency, it is preferred that until the array/color filter bonding step, the respective steps are carried out in a state of the glass substrate with protective glass, and then, after separating the glass substrate from the back surface of the protective glass plate, the liquid crystal injection step is carried out. Further, when the chemical etching treatment is carried out after the array/color filter bonding step is carried out, the glass substrate and the protective glass plate need to be separated before the chemical etching treatment is carried out.

Here, in the process for producing a display device of the present invention, both of a glass substrate on which an array is to be formed and a glass substrate on which a color filter is to be formed, may not be a glass substrate with protective glass. For example, it is possible to bond a glass substrate with protective glass on which an array is formed and an ordinary glass substrate on which a color filter is formed, or it is possible to bond an ordinary glass substrate on which an array is formed and a glass substrate with protective glass on which a color filter is formed.

Further, with reference to production of an OLED as an example, steps of forming an organic EL structure on the glass substrate with protective glass include various steps such as a step of forming a transparent electrode, a step of evaporating a hole injection layer, a hole transport layer, a luminous layer, an electron transport layer, etc., and a sealing step, and as treatments carried out in these steps, specifically, for example, film deposition treatment, evaporation treatment and treatment to bond a sealing plate may be mentioned.

After the above prescribed treatment is carried out, the glass substrate and the protective glass plate are separated. The separation may be carried out by peeling manually, but it is possible to more easily carry out peeling by providing a start of peeling at the edge portion by e.g. a blade of a razor or by injecting air into the interface of the laminate. After the peeling, the double-sided removable resin sheet may be adhered to the surface of the protective glass plate. In such a case, if there are no defects such as scars on the surface of the double-sided removable resin sheet, it is possible to use the resin sheet again for lamination with another glass substrate. However, in a case where it takes time until it is used again, it is preferred to laminate a release material on the surface of the resin sheet so as to prevent adhesion of foreign matters such as dust on the surface of the resin sheet.

On the contrary, if there are defects such as scars on the surface of the double-sided removable resin sheet, the double-sided removable resin sheet may be peeled from the surface of the protective glass plate, protective glass plate are cleaned, and then a new double-sided removable resin sheet is laminated for use for lamination with a glass substrate again. Peeling of the double-sided removable resin sheet from the protective glass plate is very easily carried out.

After the glass substrate and the protective glass plate are separated, a display device having a glass substrate can be obtained by required and desired steps. The steps carried out include, in the case of an LCD, for example, a step of reduction in thickness of the glass substrate by a chemical etching treatment, a separation step into cells having a desired size, a step of injecting liquid crystal and then sealing the inlet, a step of bonding a polarizing plate and a module formation step. In the case of an OLED, in addition to these steps, a step of assembling the glass substrate on which an organic EL structure is formed and an opposing substrate, is included.

Further, the present invention also provides a double-sided removable resin sheet for a glass substrate with protective glass, which is to be used for laminating a glass substrate and a protective glass plate.

EXAMPLES

Now, the present invention will be described in further detail with reference to Examples. However, it should be understood that the present invention is by no means restricted thereto.

Example 1

A mixture comprising 100 parts by mass of a non-solvent addition reaction silicone for release paper (KNS-320A, viscosity: 400 cs, manufactured by Shin-Etsu Silicone) and 2 parts by mass of a platinum catalyst (CAT-PL-56, manufactured by Shin-Etsu Silicone) is applied to a PET release film in a thickness of 25 μm and heat-cured at 100° C. for 30 minutes in the air, and then a PET release film (thickness: 50 μm) is bonded to obtain a silicone resins sheet (double-sided removable resin sheet) sandwiched between two release materials (PET release films).

A protective glass plate (AN100, manufactured by Asahi Glass Company, Limited) having 400 mm×300 mm×0.3 mm thick and having a linear expansion coefficient of $38×10^{-7}/°$ C., is cleaned by e.g. purified water washing and UV washing, and then one of the release materials of the silicone resin sheet (double-sided removable resin sheet) sandwiched between two release materials is peeled, and the resin sheet is bonded to the surface of the protective glass plate.

Figure 2:
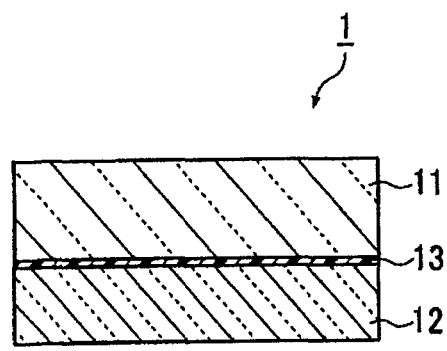
FIG. 2 is a cross-sectional schematic view illustrating a glass substrate with protective glass produced in Example 1 of the present invention.

A surface of a glass substrate (AN100, manufactured by Asahi Glass Company, Limited) having 400 mm×300 mm×0.4 mm thick and having a linear expansion coefficient of $38×10^{-7}/°$ C., on which the silicone resin sheet (double-sided removable resin sheet) is to be bonded, is cleaned by e.g. purified water washing and UV washing, and then, the release material is peeled from the silicone resin sheet (double-sided removable resin sheet), and the surface of the protective glass plate to which the silicone resin sheet (double-sided removable resin sheet) is bonded and the glass substrate are bonded by vacuum pressing at room temperature, to obtain a glass substrate with protective glass (a glass substrate 1 with protective glass) of the present invention. FIG. 2 is a cross-sectional view illustrating the glass substrate 1 with protective glass obtained in such a manner. As shown in FIG. 2, the glass substrate 1 with protective glass comprises a glass substrate 11 and a protective glass plate 12 laminated on each other by a double-sided removable resin sheet (silicone resin sheet) 13.

In the glass substrate 1 with protective glass, the glass substrate 11 is bonded to the double-sided removable resin sheet 13 without having formation of bubbles, and it has no convex defects and has suitable smoothness.

The formed glass substrate 1 with protective glass is evaluated as follows.
(1) Peel Test The glass substrate 1 with protective glass is set so that the glass substrate 11 become upside, and the glass substrate 11 is fixed by using a jig. With such a state, the protective glass plate 12 is peeled downward manually, and it is easily peeled. Further, with respect to the glass substrate 1 with protective glass after it is heat treated at 300° C. for 1 hour in the air, the peel test is also carried out, and the protective glass plate 12 is easily peeled and the heat resistance is suitable. Regardless of whether or not the heat treatment is carried out, the double-sided removable resin sheet (silicone resin sheet) 13 can easily be peeled from the protective glass plate 12 which is peeled from the glass substrate 11 in the above procedure.
(2) Peel Test (1) (Before Heating)

Figure 3:
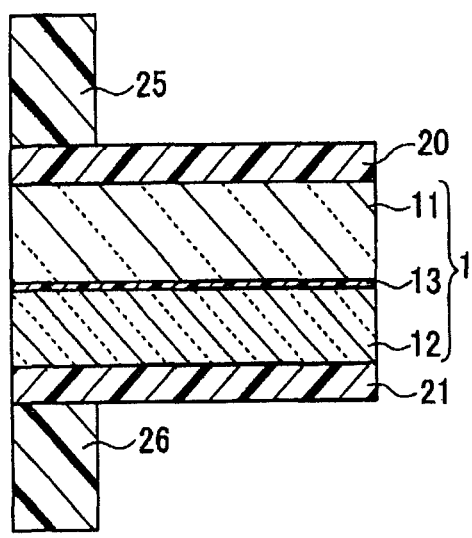
FIG. 3 is a cross-sectional schematic view illustrating the relation between a jig and the glass substrate with protective glass 1 shown in FIG. 1, during a peel test (1).

A test is carried out by a jig shown in FIG. 3. Further, for convenience of a Figure, the side length of the jig is shown shorter than the actual one.

The glass substrate 1 with protective glass is cut into a size of 50 mm×50 mm, and on surfaces of the glass substrate 11 and the protective glass plate 12 of the glass substrate 1 with protective glass, polycarbonate members 20 and 21, each having 50 mm×50 mm×5 mm thick are bonded with an epoxy two-pack adhesive for glass. Further, on each surface of the bonded polycarbonate members 20 and 21, each of polycarbonate members 25 and 26, each having 50 mm×50 mm×5 mm thick, is bonded. The position where each of the polycarbonate members 25 and 26 is bonded is, as shown in FIG. 3, at the most left end of each polycarbonate members 20 and 21 in a horizontal direction, and at a parallel position of each polycarbonate members 20 and 21 in a vertical direction.

The glass substrate 1 with protective glass having polycarbonate members 20, 21 and 25, 26 bonded thereon, is set as to have the protective glass plate 12 downside. The polycarbonate member 25 on a side of the glass substrate 11 is fixed, and when the polycarbonate member 26 on a side of the protective glass plate 12 is peeled downward in a perpendicular direction at a rate of 300 mm/min, the protective glass plate 12 is peeled when a load of 13.8 kg wt (0.55 kg wt/cm$^2$) is applied. No breakage is formed on the protective glass plate 12 or the glass substrate 11.
(3) Peel Test (1) (After Heating)

(3) A peel test (1) (after heating) is carried out in the same manner as in (2) peel test (1) (before heating) except that instead of using the glass substrate 1 with protective glass in (2) peel test (1) (before heating), a glass substrate 1 with protective glass after being heat-treated at 300° C. for 1 hour in the air after lamination is used. The protective glass plate 12 is peeled when a load of 45 kg wt (1.8 kg wt/cm$^2$) is applied. No breakage is formed on the protective glass plate 12 or the glass substrate 11.

Figure 4:
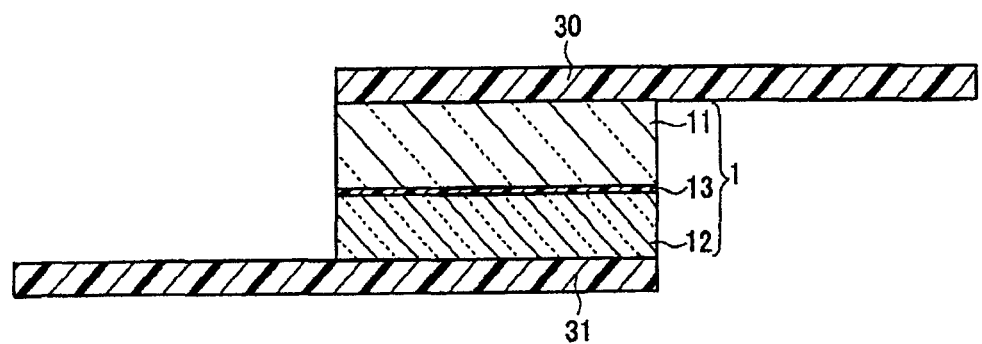
FIG. 4 is a cross-sectional schematic view illustrating the relation between a jig and the glass substrate with protective glass 1 shown in FIG. 1 during a shear strength test.

Further, the heat treatment conditions are almost the same as those of the heat treatment which is carried out when liquid crystal is formed.
(4) Shear Strength Test A test is carried out by a jig shown in FIG. 4. Further, for convenience of the Figure, the side length of the jig is shown shorter than the actual one.

The glass substrate 1 with protective glass is cut into a size of 25 mm×25 mm, and on surfaces of the glass substrate 11 and the protective glass plate 12 of the glass substrate 1 with protective glass, polycarbonate members 30 and 31, each having 25 mm×50 mm×3 mm thick are bonded with an epoxy two-pack adhesive for glass. The area for bonding is set as 25 mm×25 mm. Further, the areas for bonding are an area covering the protective glass plate 12 and a right half portion of the polycarbonate member 31, and an area covering the glass substrate 11 and a left half portion of the polycarbonate member 30.

The polycarbonate member 30 bonded on the glass substrate 11 is fixed, and the polycarbonate member 31 bonded on the protective glass plate 12 is pulled at a pulling rate of 0.5 mm/min in a lateral direction in FIG. 3 (in a length direction of the polycarbonate members 30 and 31). The protective glass plate 12 is peeled when a load of 13 kg wt (2.1 kg wt/cm$^2$) is applied. No breakage is formed on the protective glass plate 12 or the glass substrate 11. Further, the shear strength test is carried out with respect to the glass substrate 1 with protective glass after being heat-treated at 300° C. for 1 hour in the air after lamination, but the same value is obtained.
(5) Measuring Residual Adhesion Ratio The release material is peeled from one surface of the double-sided removable resin sheet (silicone resin sheet) formed in the above procedure, and a standard adhesive tape (CELLOTAPE (trademark) CT405A-15 (manufactured by NICHIBAN Co., Ltd.) with a width of 15 mm is bonded manually and heated at 70° C. for 20 hours in the air. After a lapse of 20 hours, the silicone resin sheet is peeled from the standard adhesive tape. The peeled standard adhesive tape is bonded to the surface of a clean glass substrate (e.g. AN100 (manufactured by Asahi Glass Company, Limited)), and then the 180° peel strength (300 mm/min) is measured (peel strength (A)).

The same standard adhesive tape as above is bonded to the surface of a clean glass substrate (e.g. AN100 (manufactured by Asahi Glass Company, Limited)) manually and then left at room temperature in the air for 20 hours. After a lapse of 20 hours, the standard adhesive tape is peeled from the surface of the glass substrate. The peeled standard adhesive tape is bonded to the surface of a glass substrate (e.g. AN100 (manufactured by Asahi Glass Company, Limited)), and the 180° peel strength (300 mm/min) is measured (peel strength (B)).

The residual adhesion ratio is determined from the following formula.

Residual adhesion ratio (%)=peel strength (A)/peel strength (B)×100

The residual adhesion ratio of the double-sided removable resin sheet in Example 1 is 106%.

Example 2

The glass substrate with protective glass (a glass substrate 2 with protective glass) of the present invention is obtained in the same manner as in Example 1 except that the thickness of the protective glass plate is 0.4 mm.

In the glass substrate 2 with protective glass, the glass substrate is bonded to the double-sided removable resin sheet (the silicone resin sheet) without forming bubbles, and it has no convex defects and has suitable smoothness.

When the peel test is carried out on the glass substrate 2 with protective glass, it is easy to peel the protective glass plate. Further, with respect to the glass substrate 2 with protective glass after being heat-treated at 300° C. for 1 hour in the air, the peel test is carried out, and it is easy to peel the protective glass plate, and the heat resistance is also suitable. Regardless of whether or not the heat treatment is carried out, the double-sided removable resin sheet (silicone resin sheet) can easily be peeled from the protective glass plate after peeled.

Further, in the same manner as in Example 1, with respect to the glass substrate 2 with protective glass, the peel test (1) (before heating), the peel test (1) (after heating) and the shear strength test are carried out, and in each test, the protective glass plate is peeled when a load of 13.8 kg wt (0.55 kg wt/cm$^2$), a load of 45 kg wt (1.8 kg wt/cm$^2$) and a load of 13 kg wt (2.1 kg wt/cm$^2$) are applied, respectively.

In the same manner as in Example 1, the residual adhesion ratio of the double-sided removable resin sheet (silicone resin sheet) formed by the above procedures, is measured, and the residual adhesion ratio is 106%.

Example 3

A mixture comprising 100 parts by mass of a linear polyorganosiloxane having vinyl groups at both terminals (tradename "8500", manufactured by Arakawa Chemical Industries, Ltd.), 5 parts by mass of methylhydrogen polysiloxane having hydrosilyl groups in its molecule (tradename "12031" manufactured by Arakawa Chemical Industries, Ltd.) and 5 parts by mass of a platinum catalyst (tradename "CAT12070", manufactured by Arakawa Chemical Industries, Ltd.) is applied to a PET release film (thickness: 50 μm) in a thickness of 30 μm and heat-cured at 100° C. for 30 minutes in the air, and then a PET release film is bonded to obtain a silicone resin sheet (double-sided removable resin sheet) sandwiched between two release materials (PET release films).

A protective glass plate (AN100, manufactured by Asahi Glass Company, Limited) having 400 mm×300 mm×0.3 mm thick and having a linear expansion coefficient of 38×10$^{-7}$/° C. is cleaned by e.g. purified water washing and UV washing, and then the release material on one side of the silicone resin sheet (double-sided removable resin sheet) sandwiched between two release materials is peeled, and the silicone resin sheet is bonded to the surface of the protective glass plate.

A surface of a glass substrate (AN100, manufactured by Asahi Glass Company, Limited) having 400 mm×300 mm×0.4 mm thick and having a linear expansion coefficient of 38×10$^{-7}$/° C., to which the silicone resin sheet (double-sided removable resin sheet) is to be bonded, is cleaned by e.g. purified water washing and UV washing, and then the surface of the protective glass plate to which the silicone resin sheet is bonded and the glass substrate are bonded to each other at room temperature by vacuum pressing to obtain a glass substrate with protective glass (glass substrate 3 with protective glass) of the present invention. In the glass substrate 3 with protective glass, the glass substrate is bonded to the silicone resin sheet (double-sided removable resin sheet) without forming bubbles, and it has no convex defects and has suitable smoothness.

When the peel test is carried out on the glass substrate 3 with protective glass, it is easy to peel the protective glass plate. Further, with respect to the glass substrate 3 with protective glass after being heat-treated at 300° C. for 1 hour in the air, the peel test is carried out, and it is easy to peel the protective glass plate, and the heat resistance is also suitable. Regardless of whether or not the heat treatment is carried out, the double-sided removable resin sheet (silicone resin sheet) can easily be peeled from the peeled protective glass plate.

Further, in the same manner as in Example 1, with respect to the glass substrate 3 with protective glass, the peel test (1) (before heating), the peel test (1) (after heating) and the shear strength test are carried out, and in each test, the protective glass plate is peeled when a load of 12 kg wt (0.47 kg wt/cm$^2$), a load of 12 kg wt (0.47 kg wt/cm$^2$) and a load of 12 kg wt (1.9 kg wt/cm$^2$), are applied, respectively.

In the same manner as in Example 1, the residual adhesion ratio of double-sided removable resin sheet (the silicone resin sheet) formed by the above procedures, is measured, and the residual adhesion ratio is 105%.

Example 4

A glass substrate with protective glass (a glass substrate 4 with protective glass) is obtained in the same manner as in Example 3 except that the thickness of the protective glass plate is 0.4 mm, and that the thickness of the glass substrate is 0.7 mm.

In the glass substrate 4 with protective glass, the glass substrate is bonded to the silicone resin sheet (double-sided removable resin sheet) without forming bubbles, and it has no convex defects and has suitable smoothness.

When the peel test is carried out on the glass substrate 4 with protective glass, it is easy to peel the protective glass plate. Further, with respect to the glass substrate 4 with protective glass after being heat treated at 300° C. for 1 hour in the air, the peel test is carried out, and it is easy to peel the protective glass plate, and the heat resistance is also suitable. Regardless of whether or not the heat treatment is carried out, the double-sided removable resin sheet (silicone resin sheet) can easily be peeled from the peeled protective glass plate.

Further, in the same manner as in Example 1, with respect to the glass substrate 4 with protective glass, the peel test (1) (before heating), the peel test (1) (after heating) and the shear strength test are carried out, and in each test, the protective glass plate is peeled when a load of 12.0 kg wt (0.47 kg wt/cm$^2$), a load of 12 kg wt (0.47 kg wt/cm$^2$) and a load of 12 kg wt (1.9 kg wt/cm$^2$) are applied, respectively.

In the same manner as in Example 1, the residual adhesion ratio of the silicone resin sheet (double-sided removable resin sheet) formed by the above procedures, is measured, and the residual adhesion ratio is 105%.

Example 5

In this Example of the present invention, an LCD is produced by using the glass substrate 1 with protective glass obtained in Example 1. Two glass substrates 1 with protective glass are prepared, and a step for forming an array is carried out for one of them to form an array on a surface of the glass substrate. For the other one, a step for forming a color filter is carried out to form a color filter on a surface of the glass substrate. The glass substrate 1 with protective glass on which an array is formed, and the glass substrate 1 with protective glass on which a color filter is formed, are bonded to each other, and then, a start for peeling is provided at the edge portion by a blade of a razor, and each protective glass plate is separated. On the surface of the glass substrate after the separation, there are no scratches which might lead to a strength decrease. Then, the glass substrate laminate is cut and segmentalized into 28 cells each having 51 mm×38 mm, and then, a liquid crystal injection step and a step of sealing the injection inlet are carried out to form liquid crystal cells. For formed liquid crystal cells, a step of attaching a polarizing plate is carried out, and then, a module formation step is carried out to obtain an LCD. The LCD obtained in such a manner has no problem with respect to its characteristics.

On the other hand, it is possible to easily peel the silicone resin sheet (double-sided removable resin sheet) from the peeled protective glass plate, and after the protective glass plate is cleaned, by bonding a new silicone resin sheet (double-sided removable resin sheet), it can be subjected to production of a glass substrate with protective glass again.

Example 6

In this Example of the present invention, an LCD is produced by using the glass substrate 3 with protective glass obtained in Example 3. Two glass substrates 3 with protective glass are prepared, and a step for forming an array is carried out for one of them to form an array on a surface of the glass substrate. For the other one, a step for forming a color filter is carried out to form a color filter on a surface of the glass substrate. The glass substrate 3 with protective glass on which an array is formed, and the glass substrate 3 with protective glass on which a color filter is formed, are bonded to each other, and then, a start for peeling is provided at the edge portion by a blade of a razor, and each protective glass plate is separated. On the surface of the glass substrate after the separation, there are no scratches which might lead to a strength decrease. Then, by a chemical etching treatment, the thickness of each glass substrates is adjusted at 0.3 mm. On the surface of the glass substrate after the chemical etching treatment, there is no formation of etch pits which might be optically problematic. After that, the glass substrate laminate is cut and segmentalized into 28 cells each having 51 mm×38 mm, and then, a liquid crystal injection step and a step of sealing the injection inlet are carried out to form a liquid crystal cell. For formed liquid crystal cells, a step of attaching a polarizing plate is carried out, and then, a module formation step is carried out to obtain an LCD. The LCD obtained in such a manner has no problem with respect to its characteristics.

On the other hand, it is possible to easily peel the silicone resin sheet (double-sided removable resin sheet) from the peeled protective glass plate, and after the protective glass plate is cleaned, by bonding a new silicone resin sheet (double-sided removable resin sheet), it can be subjected to production of a glass substrate with protective glass again.

Example 7

In this example of the present invention, the glass substrate 2 with protective glass obtained in Example 2 and an alkali-free glass substrate having a thickness of 0.7 mm are used to produce an LCD. The glass substrate 2 with protective glass is prepared, and a step of forming a color filter is carried out to form a color filter on the surface of the glass substrate 2 with protective glass. On the other hand, for the alkali-free glass substrate (AN-100, manufactured by Asahi Glass Company, Limited) having a thickness of 0.7 mm, a step of forming an array is carried out to form an array on the surface of the alkali-free glass substrate having a thickness of 0.7 mm.

The glass substrate 2 with protective glass on which a color filter is formed, and the alkali-free glass substrate having a thickness of 0.7 mm on which an array is formed, are bonded to each other, and then, a start for peeling is provided at the edge portion by a blade of a razor, whereby the protective glass plate is separated from the glass substrate 1 with protective glass. On the surface of the glass substrate after the separation, there are no scratches which might lead to a strength decrease. Then, the glass substrate/alkali-free glass substrate laminate is segmentalized into 28 cells each having 51 mm×38 mm by a razor cutter or scribe/break method. And then, a liquid crystal injection step and a step of sealing the inlet are carried out to form liquid crystal cells. For formed liquid crystal cells, a step of attaching a polarizing plate is carried out, and then, a module formation step is carried out to obtain an LCD. The LCD obtained in such a manner has no problem with respect to its characteristics.

On the other hand, it is possible to easily peel the silicone resin sheet (double-sided removable resin sheet) from the peeled protective glass plate, and after the protective glass plate is cleaned, by bonding a new silicone resin sheet (double-sided removable resin sheet), it can be subjected to production of a glass substrate with protective glass again.

Example 8

In this Example of the present invention, by using the glass substrate 3 with protective glass obtained in Example 3, an OLED is produced. By carrying out a step of forming a transparent electrode, a step for forming an auxiliary electrode, a step of evaporating a hole injection layer, a hole transport layer, a luminous layer, an electron transport layer, etc., and a step of sealing them, an organic EL structure is formed on the glass substrate of the glass substrate 3 with protective glass. Then, the protective glass plate is separated. On the surface of the glass substrate after the separation, there are no scratches which might lead to a strength decrease. Then, the glass substrate having the organic EL structure formed on the substrate is cut by using a razor cutter or a scribe/break method, and segmentalized into 40 cells each having 41 mm×30 mm, and then, the glass substrate on which the organic EL structure is formed, and an opposing substrate, are assembled, and a module formation step is carried out to produce an OLED. The OLED obtained in such a manner has no problem with respect to its characteristics.

On the other hand, it is possible to easily peel the silicone resin sheet (double-sided removable resin sheet) from the peeled protective glass plate, and after the protective glass plate is cleaned, by bonding a new silicone resin sheet (double-sided removable resin sheet), it can be subjected to production of a glass substrate with protective glass again.

Example 9

A glass substrate with protective glass (glass substrate 5 with protective glass) is obtained in the same manner as in Example 3 except that the thickness of the protective glass plate is 0.6 mm and the thickness of the glass substrate is 0.1 mm.

In the glass substrate 5 with protective glass, the glass substrate is bonded to the silicone resin sheet (double-sided removable resin sheet) without forming bubbles, and it has no convex defects and has suitable smoothness.

When the peel test is carried out on the glass substrate 5 with protective glass, the protective glass plate can easily be peeled. Further, with respect to the glass substrate 5 with protective glass after being heat-treated at 300° C. for one hour in the air, the peel test is carried out, and it is easy to peel the protective glass plate, and the heat resistance is also suitable. Regardless of whether or not the heat treatment is carried out, the double-sided removable resin sheet (silicone resin sheet) can easily be peeled from the protective glass plate after peeled.

Example 10

In this Example of the present invention, an LCD is produced by using the glass substrate 5 with protective glass obtained in Example 9. Two glass substrates 5 with protective glass are prepared, and a step for forming an array is carried out for one of them to form an array on the surface of the glass substrate. For the other one, a step for forming a color filter is carried out to form a color filter on the surface of the glass substrate. The glass substrate 5 with protective glass on which an array is formed, and the glass substrate 5 with protective glass on which a color filter is formed, are bonded to each other, and then, a start for peeling is provided at the edge portion by a blade of a razor, and each protective glass plate is separated. On the surface of the glass substrate after the separation, there are no scratches which might lead to a strength decrease. Then, the glass substrate laminate is cut and segmentalized into 28 cells each having 51 mm×38 mm, and then, a liquid crystal injection step and a step of sealing the injection inlet are carried out to form liquid crystal cells. For formed liquid crystal cells, a step of attaching a polarizing plate is carried out, and then, a module formation step is carried out to obtain an LCD. The LCD obtained in such a manner has no problem with respect to its characteristics.

On the other hand, it is possible to easily peel the silicone resin sheet (double-sided removable resin sheet) from the peeled protective glass plate, and after the protective glass plate is cleaned, by bonding a new silicone resin sheet (double-sided removable resin sheet), it can be subjected to production of a glass substrate with protective glass again.

Comparative Example 1

A protective glass plate (AN100, manufactured by Asahi Glass Company, Limited) having 400 mm×300 mm×0.3 mm thick and having a linear expansion coefficient of $38\times10^{-7}$/° C., is cleaned by e.g. purified water washing and UV washing, and then, a mixture comprising 100 parts by mass of a non-solvent addition reaction silicone for release paper (KNS-320A, viscosity: 400 cs, manufactured by Shin-Etsu Silicones) and 2 parts by mass of a platinum catalyst (CAT-PL-56, manufactured by Shin-Etsu Silicone) is applied (application amount: 30 g/m²) to the above protective glass plate by a screen printing machine, and is heat-cured at 100° C. for 30 minutes in the air to obtain a silicone resin sheet having a thickness of 20 μm.

A surface of a glass substrate (AN100, manufactured by Asahi Glass Company, Limited) having 400 mm×300 mm×0.4 mm thick and having a linear expansion coefficient of $38\times10^{-7}$/° C., to which the silicone resin layer is to be bonded, is cleaned by e.g. purified water washing and UV washing, and then the surface of the protective glass plate on which the silicone resin layer is formed and the glass substrate are laminated by vacuum pressing at room temperature to obtain a glass substrate with protective glass (glass substrate 6 with protective glass).

An LCD is obtained in the same manner as in Example 5 except that the glass substrate 6 with protective glass is used instead of the glass substrate 1 with protective glass.

The silicone resin layer cannot easily be peeled wince the silicone resin layer is strongly adhered to the surface of the peeled protective glass plate.

INDUSTRIAL APPLICABILITY

The glass substrate with protective glass obtained by the present invention may be used as a glass substrate for various display devices.

The entire disclosure of Japanese Patent Application No. 2007-061889 filed on Mar. 12, 2007 including specification, claims, drawings and summary is incorporated herein by reference in its entirety.

What is claimed is:

1. A process comprising producing a display device by using a glass substrate with protective glass, which comprises
    laminating a glass substrate and a protective glass plate by a double-sided removable resin sheet,
    carrying out a prescribed treatment for producing the display device on the glass substrate,
    separating the glass substrate from the protective glass plate, and
    completing formation of the display device, wherein
    said laminating comprises removing, from one side of the double-sided removable resin sheet having a release material laminated on both sides, the release material, so that the resin sheet is adhered to and laminated on the surface of either the glass substrate or the protective glass plate, and then removing the release material from the other side of the double-sided removable resin sheet so that the sheet is adhered to and laminated on the surface of the other one of the glass substrate and the protective glass plate,
    wherein the double-sided removable resin sheet is a silicone resin sheet made of a cured product of silicone, which is a crosslinked product of a linear polyorganosiloxane and a methylhydrogen polysiloxane having hydrosilyl groups in its molecule,
    wherein the linear polyorganosiloxane is either
    (a) a linear polyorganosiloxane having vinyl groups at both terminals and in its side chain, or
    (b) a linear polyorganosiloxane having vinyl groups at both terminals or in its side chain,
    wherein the display device is a liquid crystal display device or an organic electroluminescent display device.

2. The process for producing a display device by using a glass substrate with protective glass according to claim 1, wherein before curing, the cured product of silicone has a molar ratio of hydrosilyl groups of the methylhydrogen polysiloxane to vinyl groups of the linear polyorganosiloxane being from 1.3/1 to 0.7/1.

3. The process for producing a display device by using a glass substrate with protective glass according to claim 1, wherein the double-sided removable resin sheet having a release material laminated on both sides, is formed by applying silicone to the release face of one of the release materials and curing it, and then laminating the other release material on the surface of the removable resin sheet.

4. The process for producing a display device by using a glass substrate with protective glass according to claim 3, wherein the silicone is heat-cured at a temperature of from 50 to 250° C.

5. A process comprising producing a display device by using a glass substrate with protective glass, which comprises
laminating a glass substrate and a protective glass plate by a double-sided removable silicone resin sheet having releasability and non-adhesive property on both sides,
carrying out a prescribed treatment for producing the display device on the glass substrate,
separating the glass substrate from the protective glass plate, and
completing formation of the display device, wherein
said laminating comprises removing, from one side of the double-sided removable resin sheet having a release material laminated on both sides, the release material, so that the resin sheet is adhered to and laminated on the surface of either the glass substrate or the protective glass plate, and then removing the release material from the other side of the double-sided removable resin sheet so that the sheet is adhered to and laminated on the surface of the other one of the glass substrate and the protective glass plate,
wherein the display device is a liquid crystal display device or an organic electroluminescent display device
wherein the double-sided removable resin sheet is a silicone resin sheet made of a cured product of silicone, which is a crosslinked product of a linear polyorganosiloxane and a methylhydrogen polysiloxane having hydrosilyl groups in its molecule, and
wherein the linear polyorganosiloxane is either
(a) a linear polyorganosiloxane having vinyl groups at both terminals and in its side chain, or
(b) a linear polyorganosiloxane having vinyl groups at both terminals or in its side chain.

6. A process comprising producing a display device by using a glass substrate with protective glass, which comprises
laminating a glass substrate and a protective glass plate by a double-sided removable silicone resin sheet having releasability and peelability on both sides,
carrying out a prescribed treatment for producing the display device on the glass substrate,
separating the glass substrate from the protective glass plate, and
completing formation of the display device, wherein
said laminating comprises removing, from one side of the double-sided removable resin sheet having a release material laminated on both sides, the release material, so that the resin sheet is adhered to and laminated on the surface of either the glass substrate or the protective glass plate, and then removing the release material from the other side of the double-sided removable resin sheet so that the sheet is adhered to and laminated on the surface of the other one of the glass substrate and the protective glass plate, and wherein
said peelability is defined by a peeling force of at most 2 kg wt/cm$^2$ according to a peel test in which the laminated glass substrate and protective glass plate is subjected to a heat treatment at 300° C. for 1 hour in air,
wherein the display device is a liquid crystal display device or an organic electroluminescent display device
wherein the double-sided removable resin sheet is a silicone resin sheet made of a cured product of silicone, which is a crosslinked product of a linear polyorganosiloxane and a methylhydrogen polysiloxane having hydrosilyl groups in its molecule, and
wherein the linear polyorganosiloxane is either
(a) a linear polyorganosiloxane having vinyl groups at both terminals and in its side chain, or
(b) a linear polyorganosiloxane having vinyl groups at both terminals or in its side chain.

7. A process comprising producing a display device by using a glass substrate with protective glass, which comprises
laminating a glass substrate and a protective glass plate by a double-sided removable silicone resin sheet having releasability and manually peelable from both the glass substrate and the protective glass plate,
carrying out a prescribed treatment for producing the display device on the glass substrate,
separating the glass substrate from the protective glass plate, and
completing formation of the display device, wherein
said laminating comprises removing, from one side of the double-sided removable resin sheet having a release material laminated on both sides, the release material, so that the resin sheet is adhered to and laminated on the surface of either the glass substrate or the protective glass plate, and then removing the release material from the other side of the double-sided removable resin sheet so that the sheet is adhered to and laminated on the surface of the other one of the glass substrate and the protective glass plate, wherein
said manual peelability is defined by a peeling force of at most 2 kg wt/cm$^2$ according to a peel test in which the laminated glass substrate and protective glass plate is subjected to a heat treatment at 300° C. for 1 hour in air,
wherein the display device is a liquid crystal display device or an organic electroluminescent display device
wherein the double-sided removable resin sheet is a silicone resin sheet made of a cured product of silicone, which is a crosslinked product of a linear polyorganosiloxane and a methylhydrogen polysiloxane having hydrosilyl groups in its molecule, and
wherein the linear polyorganosiloxane is either
(a) a linear polyorganosiloxane having vinyl groups at both terminals and in its side chain, or
(b) a linear polyorganosiloxane having vinyl groups at both terminals or in its side chain.

8. The process for producing a display device by using a glass substrate with protective glass according to claim 1, wherein the resin sheet has a thickness within a range of $Y=50X+20\pm10$, and wherein the thickness of the thinner of the glass substrate and the protective glass plate is X mm and the thickness of the resin sheet is Y μm.

9. The process for producing a display device by using a glass substrate with protective glass according to claim 2, wherein the molar ratio of hydrosilyl groups of the methylhydrogen polysiloxane to vinyl groups of the linear polyorganosiloxane is from 0.8/1 to 1.2/1.

10. The process for producing a display device by using a glass substrate with protective glass according to claim 1, wherein linear polyorganosiloxane (a) has the following formula:

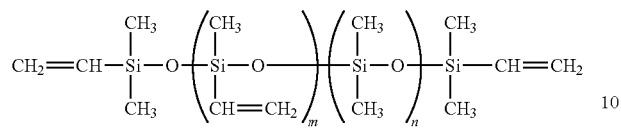

wherein n is an integer or 0, and m is an integer of at least 1;

linear polyorganosiloxane (b) has the following formula:

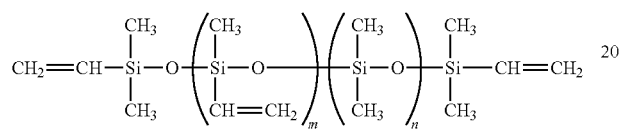

wherein n is an integer or 0, and m is 0, or the following formula:

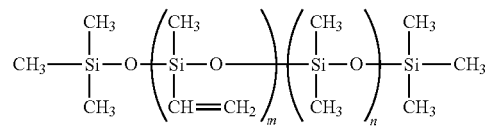

wherein n is an integer or 0, and m is an integer of at least 2; and the methylhydrogen polysiloxane having hydrosilyl groups in its molecule is a compound represented by the following formula:

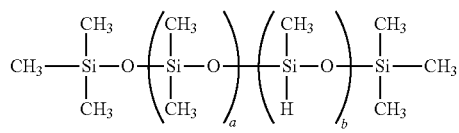

wherein a is an integer, and b is an integer of at least 1, and optionally, one or more terminal methyl groups may be hydrogen or hydroxyl groups.

\* \* \* \* \*